United States Patent
Singh et al.

(10) Patent No.: US 7,651,552 B2
(45) Date of Patent: Jan. 26, 2010

(54) GAS PORT ASSEMBLY

(75) Inventors: Nityalendra Singh, Bradley Stoke (GB); Simon Hall, Bristol (GB)

(73) Assignee: Oxford Instruments Plasma Technology Limited, Oxford (GB)

( * ) Notice: Subject to any disclaimer, the term of this patent is extended or adjusted under 35 U.S.C. 154(b) by 610 days.

(21) Appl. No.: 10/595,744

(22) PCT Filed: Oct. 27, 2004

(86) PCT No.: PCT/GB2004/004542

§ 371 (c)(1),
(2), (4) Date: May 9, 2006

(87) PCT Pub. No.: WO2005/052980

PCT Pub. Date: Jun. 9, 2005

(65) Prior Publication Data

US 2007/0194039 A1    Aug. 23, 2007

(30) Foreign Application Priority Data

Nov. 13, 2003   (GB)   ................. 0326500.6

(51) Int. Cl.
*B03C 3/00* (2006.01)
*B03C 3/155* (2006.01)
*H01J 37/32* (2006.01)
(52) U.S. Cl. .............. 96/55; 96/66; 96/68; 96/70; 55/385.1; 55/485; 55/486; 55/511; 55/523; 118/723 R; 118/723 E; 118/723 ER; 118/723 IR; 204/298.02; 204/298.07
(58) Field of Classification Search .......... 96/55, 96/66, 68, 69, 70, 71; 55/385.1, 482, 485, 55/486, 487, 488, 489, 511, 523; 118/723 R, 118/723 E, 723 ER, 723 IR; 204/298.02, 204/298.07
See application file for complete search history.

(56) References Cited

U.S. PATENT DOCUMENTS 3,520,110 A * 7/1970 Knauer ................. 55/486

(Continued)

FOREIGN PATENT DOCUMENTS

EP        1008674        6/2000

(Continued)

OTHER PUBLICATIONS

Torres, J.M, et al., "Electric Field Breakdown at Micrometre Separations in Air and Vacuum", Microsystems Technologies 6, 1999, pp. 6-10, Springer-Verlag.

(Continued)

*Primary Examiner*—Jason M Greene
(74) *Attorney, Agent, or Firm*—Vern Maine & Associates

(57) ABSTRACT

A gas port assembly is provided for supplying or removing one or more gases to a powered electrode in a plasma processing chamber. The chamber has at least one electrode (11) to which an alternating electrical potential is applied in use, the assembly being electrically insulated from the electrode(s). The assembly comprises, a number of dielectric members (15) and a number of electrically conductive members (16). The members are arranged in a stack of alternating dielectric and electrically conductive members. Each member comprises at least one gas pathway for the passage of the gas(es), such that when stacked, the gas pathways are in communication with each other and the gas(es) are able to pass between an outer side of the stack and a chamber side of the stack. The members act as a capacitive divider to reduce high voltages within the assembly.

22 Claims, 2 Drawing Sheets

U.S. PATENT DOCUMENTS

| | | | | |
|---|---|---|---|---|
| 5,542,559 | A | * | 8/1996 | Kawakami et al. ....... 118/723 E |
| 6,873,112 | B2 | * | 3/2005 | Wilcoxson et al. ..... 118/723 IR |
| 2007/0170867 | A1 | * | 7/2007 | Persing et al. ......... 315/111.21 |

FOREIGN PATENT DOCUMENTS

| | | |
|---|---|---|
| JP | 61067922 | 4/1986 |

OTHER PUBLICATIONS

Gompf, Raymond, "Triboelectric Testing at KSC Under Low Pressure and Temperature", National Aeronautics and Space Administration, 1984, pp. 1-6.

Paschen, F., "Breakdown Voltage vs. Pressure Paschen's Law and The Paschen Curve", 1889, pp. 69-96.

PCT Search Report dated Dec. 9, 2004 of Patent Application No. PCT/GB2004/004542 filed Oct. 27, 2004.

* cited by examiner

GAS PORT ASSEMBLY

This invention relates to a gas port assembly, for example for use with low pressure plasma processing apparatus. In particular the invention relates to the use of a gas port assembly for supplying and removing gas(es) to and from a chamber across a live electrode.

Semiconductor processing involves depositing and etching metals, dielectrics and semiconductor materials upon substrates. The deposition process is usually performed by plasma enhanced chemical vapour deposition (PECVD) in a parallel plate type reactor. The main components of a PECVD system include a gas delivery system, an upper live electrode assembly comprising a showerhead assembly through which gas is supplied, an electrically grounded process chamber connected to a grounded lower electrode, serving as a support for the substrate being processed and a high frequency power source. The high frequency power source in a PECVD system is in the 50 kHz to 450 kHz frequency range or at 13.56, 27.12, 40 MHz radio frequencies (RF) or a mixture of both frequencies so as to generate a plasma.

The gas delivery to an electrically powered electrode in a PECVD system is achieved via a gas feed assembly comprising a gas inlet pipe and an insulating section. The gas inlet pipe is normally metal for reasons of strength and is at ground potential for reasons of security. However, by applying power to the upper electrode, unwanted discharges can be formed in the insulated conduits of the gas delivery assembly. The unwanted discharges resulting from the interaction of the RF potential with the gas assembly may appear as sparks or glows which can damage some if not all of the components of a gas feed assembly. Repetitive sparking leads to gas assembly failure, resulting in taking a production system offline for maintenance.

There have been attempts by semiconductor equipment manufacturers to solve this problem by designing gas feed geometries with tortuous paths for the gas flow. These designs have had some success but are not really production worthy as failures still happen.

As such, a gas port assembly is required, that can withstand plasma arcing and glow discharges under a wide range of plasma conditions in a production environment. The assembly should not only be simple in design but also reliable and robust under a whole range of operating conditions. It should offer strong resistance against plasma ignition and random discharges across a wide range of process conditions.

In known PECVD systems, the live metal of the upper electrically powered electrode is usually made of a metal such as aluminium. The gas port assembly is usually encased in an insulating body. The weak area of an insulation system is usually at the interfaces of the insulating material and the conductor. If gaps are introduced during operation, high electrical stressing will result in discharge activity and this eventually leads to failure of the gas port assembly.

The aim of this invention is to provide a robust insulation system applicable at higher voltages, in excess of 2 kVpp and which complies with Paschen tolerance gaps. As such it should able to handle peak working voltages higher than the peak applied voltage to the electrode. Hence, a parameter such as the breakdown voltage is very important and needs to be integrated early in the gas port assembly design.

Another aspect that needs to be considered in gas port design is the Paschen breakdown voltage. The breakdown of a gas in a gap obeys a Paschen curve, (ref. *Paschen F* 1889 *Wied. Ann* 37; pp 69-96), that is commonly known to plasma physicists as Paschen's Law. The law essentially states that, at higher pressures (above a few Torrs) the breakdown voltage V of a gap is a function, generally not linear, of the product of the gas pressure in the gap and the length of the gap, usually written as $V=f(pd)$ where p is the pressure and d is the gap distance. It should be noted however that the Paschen curve is not applicable for gaps of the order of some microns, see for example J. M Torres, R S. Dhariwal, "*Electrical field breakdown at micrometer separations in air and vacuum*", *Microsystems Technologies* 6 (1999), pp 6-10, Springer-Verlag.

The Paschen voltage is closely related to the geometry of the environment and readily changes with regard to distance, pressure, and geometry as discussed in Raymond Gopf, "*Triboelectric testing for electrostatic charges on materials at Kennedy Space Centre*", *EOC/ESD Symposium Proceedings*, EOS-6, pp 58-63, 1984, NASA. The Paschen curve as such can be used to identify the maximum voltage that can be obtained between two surfaces under controlled pressure conditions before breakdown occurs. For the same geometric shape, as the pressure is lowered, the maximum voltage obtainable decreases to a minimum value and then increases as the pressure is lowered further. The Paschen Curve also relates the plasma ignition voltage to pressure in the chamber showing that at a certain pressure, a minimum voltage is required to ignite the plasma. At pressures both below and above that pressure, it becomes more difficult to ignite the plasma. At significantly lower pressures, there is a shortage of ionizing species in the chamber and at significantly higher pressures the abundance of gas molecules creates a short mean free path that inhibits plasma formation.

The Paschen voltage is the regulator of the maximum surface voltage that can generally be developed on a surface under low pressures and acts as a maximum voltage buffer of surface voltage.

In accordance with a first aspect of the invention we provide a gas port assembly for supplying or removing one or more gases to or from a plasma processing chamber, the chamber having at least one electrode to which an alternating electrical potential is applied in use, the assembly being electrically insulated from the electrode(s), the assembly comprising, a number of dielectric members and a number of electrically conductive members, the members being arranged in a stack of alternating dielectric and electrically conductive members, and wherein each member comprises at least one gas pathway for the passage of the gas(es), such that when stacked the gas pathways are in communication with each other and the gas(es) are able to pass between an outer side of the stack and a chamber side of the stack, the members acting as a capacitive divider to reduce high voltages within the assembly.

The whole assembly can therefore be seen as a vacuum gas capacitor having a peak operating voltage. Its main function is to reduce high operating voltages to a more manageable voltage. In order to achieve this, the gas port assembly has to be designed to cater for gas dynamic effects resulting from pressure variations in the conduits leading to the electrically driven electrode.

This is a significant advance over methods used in the prior art, which rely upon the use of tortuous paths within such port assemblies, these paths having narrow dimensions so as to prevent discharges in accordance with the Paschen curves of the materials and gases in question.

The present invention provides improved performance thereby giving advantages in terms of the use of electric fields of increased magnitude and also in increased system reliability due to the reduction or complete removal of the discharging within the assembly.

The present invention provides a gas port assembly, which is simple to manufacture, requires very few components and still achieves the desired system performance under a wide range of operating conditions.

The gas port assembly is typically used as a gas inlet although it will be appreciated that it could also be used as a gas outlet. A number of factors influence the choice of the number of members of each type within the stack. These include the physical dimensions of the desired assembly, the materials used, the electrical field, the operational differential in the gas pressure between the chamber and outer sides of the stack and the gas type(s). The electrically conductive members may in principle be formed from any electrically conducting material including metals, semi-metals, certain polymers and so on.

Whilst two dielectric members may be used, preferably at least three dielectric members and at least two metallic (electrically conductive) members are provided. This provides a good compromise between the desired functionality and the additional cost and complexity of the assembly. The gas pathways within the assembly are preferably arranged relative to one another such that the gas(es) follow a pre-defined path through the assembly. This allows control of the pressure differential and improvement in the mixing between the process gases. The dielectric members are preferably arranged as discs although these need not have a circular cross-section, and the gas pathways are provided by a number of ducts within each disc. The ducts are positioned at (radial and/or circumferential) locations (with respect to the disc centre), which are dissimilar to those within an adjacent disc within the stack. This enhances the tortuous nature of the gas pathways without the need for specialised alignment or assembly.

Preferably the ducts are of narrow dimension, typically being less than about 2 mm in diameter so as to reduce the possibility of electrical discharge within them.

A number of dielectric materials are suitable for use as with the dielectric members. Low k and high k dielectric materials such as PTFE, alumina or PTFE/ceramic composite materials can be used. For example thermoplastic materials may also be used, although preferably the dielectric member(s) is formed from PTFE, due to its beneficial electrical properties and relatively low cost.

The electrically conductive members may take a number of configurations that include gas pathways within them. However, so as to enhance their effect, they are preferably formed as metallic gauzes or meshes. As such, mesh count and wire diameter determining the aperture, open area and the strength of the material are important. Preferably such metallic members are formed from corrosion resistant materials such as stainless steel type 316 or nickel alloys such as nickel 201 or Monel.

A further advantage of these gauzes or meshes is that they may be arranged with a density such that they act as particle filters and therefore remove gas-borne particles which may otherwise degrade the quality of the processed substrate within the chamber.

The gas port assembly, and in particular the members, is preferably adapted to reduce discharges when the electrode(s) is operated at the predetermined operational frequency, or a range of such frequencies. Typically such frequencies are radio frequencies, for example one frequency being 13.56 MHz. The assembly is also preferably arranged to operate with an electrode having energy dissipation up to 5 kilowatts. Similarly, the assembly is preferably adapted for use at a gas flow rate in the range of 10 to 5000 standard cubic cm per minute (sccms). Furthermore, preferably the gas port assembly is adapted for use with a gas pressure within the chamber in the range of 5 to 10000 mTorr.

The gas port assembly may therefore be manufactured and supplied independently of the plasma processing apparatus in association with which it is designed for use.

It is contemplated that the gas port assembly may be provided as a kit comprising a number of dielectric and electrically conductive members, which may be of different sizes and/or materials. A user may then select the number and type of members required for a particular desired purpose from those provided.

The assembly itself may also comprise the one or more electrodes of the chamber, to which the alternating electrical potential is supplied when in use. In this case the assembly preferably also further comprises an insulator for electrically insulating the members of the assembly from the electrode(s). Alternatively, the assembly may comprise only the insulator mentioned above, and not the one or more electrodes themselves.

In any of the above cases, the assembly may also further comprise a coupling device such that the assembly may be removably coupled to the chamber. This allows the removable-fitting of known apparatus so as to improve its performance.

In accordance with another aspect of the present invention, we provide plasma processing apparatus comprising a chamber to which one or more gases are introduced when in use, the gas(es) being used to generate a plasma within the chamber;

at least one electrode to which an alternating electrical potential is applied in use so as to generate the plasma;

one or more gas port assemblies according to the first aspect of the invention, for supplying or removing gas(es) to or from the chamber; and at least one insulator for electrically insulating the one or more gas port assemblies from the electrode(s).

The assembly can therefore be incorporated into and supplied as part of the plasma processing apparatus. Although primarily one such assembly has been mentioned above for use with or part of such apparatus, it will be appreciated that a plurality of such assemblies can be used.

An example of a gas port assembly and plasma processing apparatus comprising such an assembly, is now described in detail with reference to the accompanying drawings, in which:—

Figure 1:
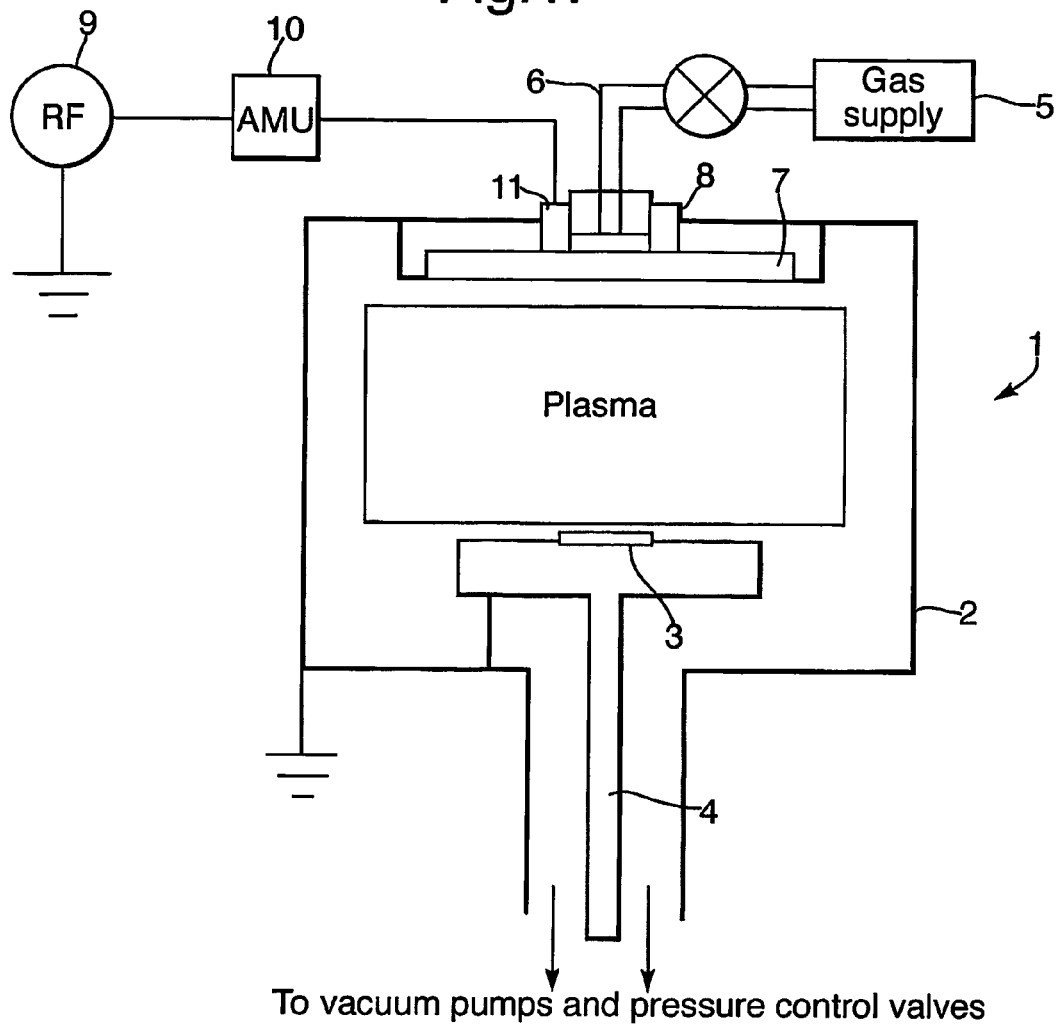
FIG. 1 shows a schematic PECVD system including a gas port assembly according to the invention.

FIG. 1 is a schematic illustration of a plasma enhanced chemical vapour deposition (PECVD) system according to the invention and is generally indicated at 1. This comprises a chamber 2, within which a plasma is formed from a low pressure gas. A substrate 3 is positioned in use upon a lower electrode 4 within the chamber. A gas supply 5 supplies one or more gases to the chamber 2 along a conduit 6, the gases being introduced into the chamber via a gas port assembly 8 in an upper wall of the chamber, beneath which is positioned a showerhead 7 which is arranged in a known manner to evenly distribute the gases to the region above the substrate 3. The gas port assembly 8 and showerhead 7 are each positioned approximately centrally within the chamber 2. The gas port assembly 8 is also positioned within the centre of an upper electrode 11 within the upper wall of the chamber.

A radio frequency generator 9 and auto match unit 10 are used to power the upper electrode at an RF frequency. The upper electrode 11 is insulated from the upper wall of the chamber 2 to which it is mounted, and each of the chamber 2 and lower electrode 4 are connected to electrical ground. In use, the RF generator 9 and auto match unit 10 are operated so as to provide RF electrical power to the upper electrode so as to generate a plasma within the processing chamber. The substrate 3 is therefore, treated by the PECVD process.

It has been observed that plasmas can form in prior art gas inlets when the voltage applied to the electrode exceeds certain thresholds. For example, arcing has been occasionally observed at voltages of about 2 kVpp (peak to peak) at 13.56 MHz. Thus, there is a need for a gas inlet assembly that can handle high peak voltages and reduce plasma formation, glow discharges and arcing, during flow of gas into the chamber.

The gas port assembly 8 according to the invention, arranged here as a gas inlet, provides gas to the chamber 2 under vacuum, via the live upper electrode 11. The invention has arisen from a realisation that the inlet port can be considered in terms of the interaction of a live metal with an insulator 11. In this case, the live metal is the upper electrode, which is usually made of aluminium, and the insulator is the gas port assembly, which in this case is arranged as a gas inlet. The gas inlet assembly is considered as a gas capacitor under vacuum. As such, this problem is simplified greatly into an electrical one and the breakdown voltage, is important and is therefore considered in the design.

Figure 2:
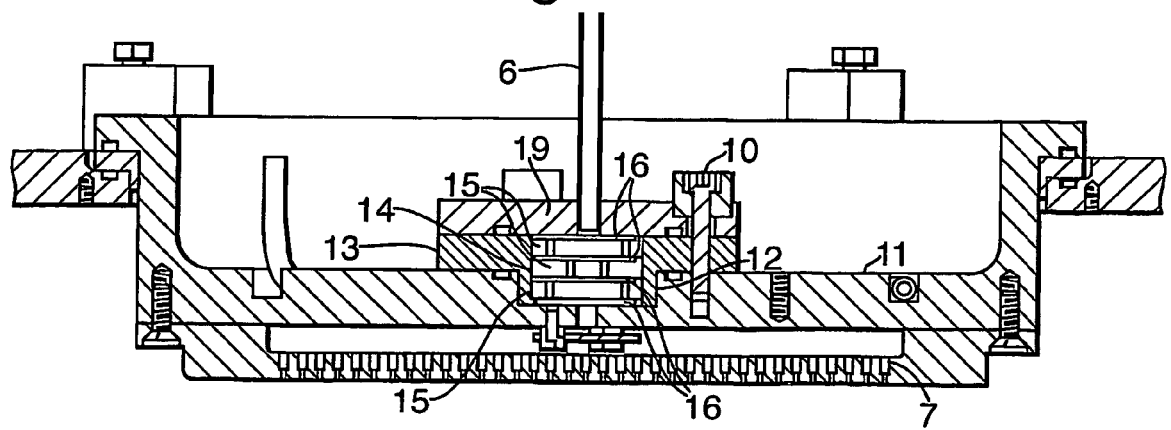
FIG. 2 is a view partly in section, showing the upper electrode with the embedded gas port assembly in more detail.

Referring now to FIG. 2, the upper electrode 11 including the showerhead 7 has a stepped bore 12, within which is positioned a sub-assembly. The bore 12 has an upper part of relatively large diameter opening on to an upper surface of the electrode 11, and a part of smaller diameter within the live electrode, and opening on to the lower surface of the live electrode 11 beneath which lies the showerhead 7. An annular insulator 13 made of PTFE is fitted within the upper and lower parts of the bore 12 due to its complementary shape and also has a central bore of constant diameter, this diameter being slightly less than that of the lower part of the bore 12, thereby defining an insulator bore 14. Within the insulator bore 14 are positioned a number of washers 15 (dielectric members), these taking the form of discs of circular cross-section formed from PTFE.

The washers 15 are stacked axially within the bore 14, which is also of circular cross-section, so as to form a tight fit and thereby preventing the passage of gas around the sides of the washers down along the interface between the washers and the insulator 13. It should be noted that one or more of the washers 15 can be an integral part of the insulator 13. At a position between each of the washers 15, so as to separate them, and in addition, above the top most and below the bottom most washer within the stack, a number of meshes 16 (metallic electrically conductive members) are positioned (indicated schematically in FIG. 2), these being formed from a corrosion resistant alloy such as nickel 201. In this case, the cross-section of the meshes is less than that of the washers.

The washers 15 are each of thickness 10 mm or less and provided with a plurality of holes (ducts) as predefined flow paths, there being typically 4 or more such holes having a small diameter of 2 mm or less. The holes may be straight or angled with respect to the washer axis. The flow holes may be arranged along, for example, a plurality of circles concentric with the outer diameter of the washers. However, the flow holes of the first washer differ in their arrangement pattern from the flow holes of the second washer so that when the washers are axially aligned with each other, the positions of the holes do not coincide. In other words, when viewed axially through the flow holes, the flow holes in subsequent washers cannot be seen. The third washer can be arranged similarly to the first washer or differently so as to maintain this alignment condition. Since the flow holes of the first washer do not coincide in the arrangement pattern with the flow holes of the second washer, the gas flow path is caused to deflect at the transition from one washer to the next washer within the region between them formed by the presence of the meshes, each region acting as a buffer portion. The final washer and the bottom mesh forms an equipotential with the live electrode thereby securely preventing the occurrence of any electrical discharge.

The flow path of the gas communicates at its upper end with a grounded metallic disc 19 at equipotential with ground and at its lower end with the live electrode 11. Gases are provided to the sub-assembly from the conduit 6 connected to a central bore passing through the disc 19. In order to eliminate the effect of any parasitic electrical field, importantly the top and bottom meshes are potentially accommodated in circular recesses within the washer surfaces (of depth about 0.5 mm) so as to smooth out the electric field and thereby acting as a filter against any parasitic fringe fields thus making the Paschen start voltage even higher.

The intention of this example is to suppress both the axial and lateral electric fields in the gas port assembly.

In addition, the gas flow holes through the washers preferably have an aspect ratio of width to height that is low to prevent plasma formation. The ratio of width to height is typically between 0.2 and 1.0.

The arrangement of the washers also introduces a swirl component to the gas flow. This swirl component helps in mixing the process gases prior to delivery in the plasma chamber.

Figure 3:
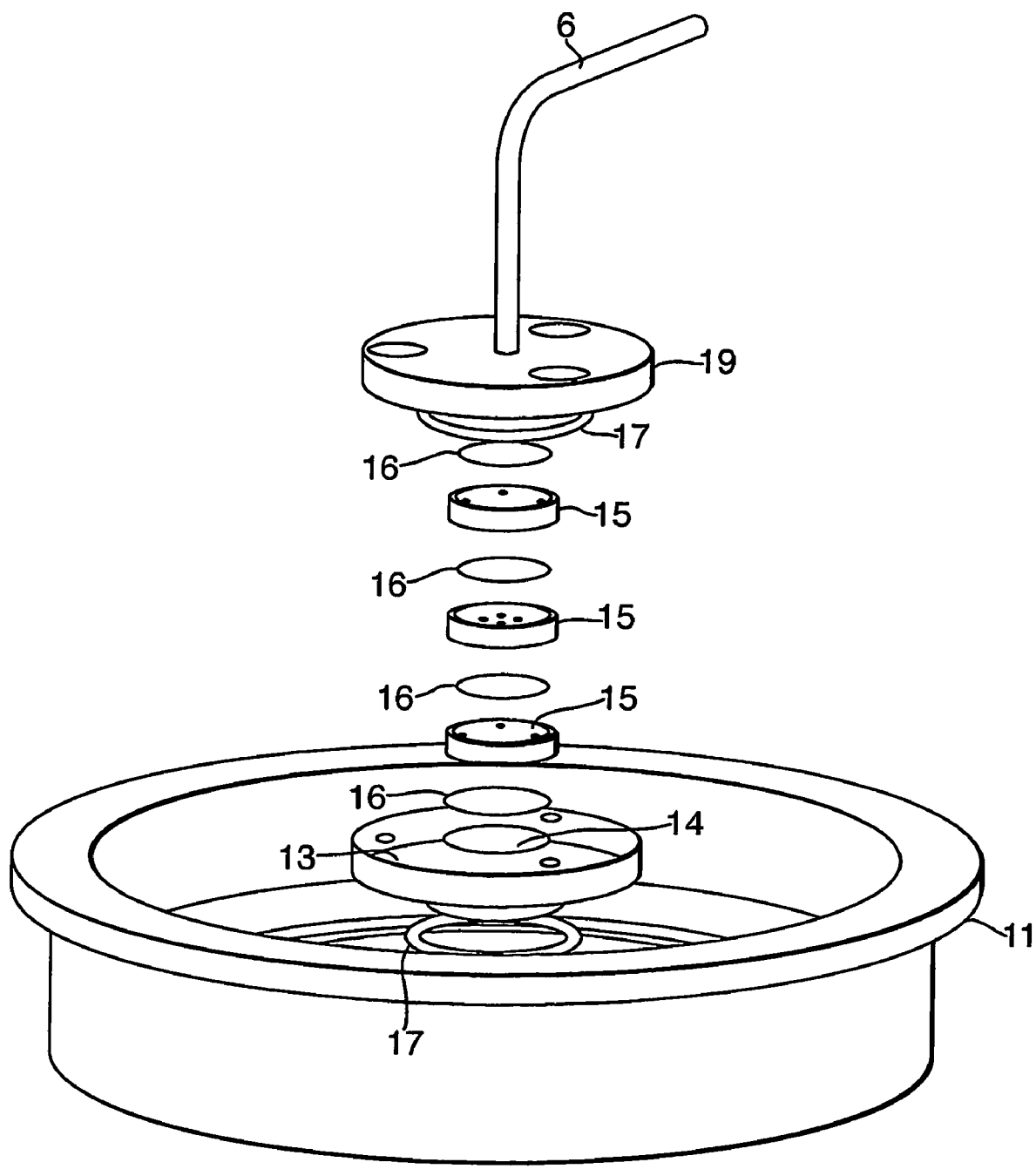
FIG. 3 is an exploded view of a practical implementation.

A more detailed illustration of the gas port assembly is shown in FIG. 3, which is a practical implementation. In the exploded view shown in FIG. 3, the position of the washers 15 and meshes 16 is indicated. These are inserted into the bore 14 within the insulator 13, this in turn having a lower part fitted into the electrode 11.

To provide a gas seal, O-rings 17 are also provided along with complementary annular grooves in the lower surface of the metallic disc and the upper surface of the upper electrode 11.

The dielectric material for the washers and/or the insulator 13 can be made from a ceramic material. In the present example, the dielectric material of the washers is PTFE. PTFE is useful as it is readily available, has a dielectric constant 2.2 and has a high breakdown strength of around 100 V/micron when compared to ceramics such as $Al_2O_3$ or AlN, which has breakdown strengths varying from about 4 to 40 V/micron. The dimensions of the ducts are small enough to reduce plasma formation therein (by reducing the mean free path of the gas in the passage) and preferably for PTFE comprise a diameter equal to or less than about 2 mm to satisfy Paschen's law.

The meshes 16 inserted between the PTFE washers in the gas port assembly are of the woven type also known as wire gauze or wire cloth. The gauze can be made from corrosion resistant materials such as stainless steel or nickel based alloys. Nickel 201 is recommended since it is the best anti-corrosive material readily available.

The aspect of the Paschen curve that is incorporated in this example of the invention is the differences between the Paschen characteristics between insulators and metals. The insulating material Paschen curve is significantly higher than a metal Paschen curve and hence is not voltage limited by the metal Paschen curves. Therefore, insulators can carry much higher surface voltages.

A further advantage of this invention is that the metallic gauzes also act as a particle filter. As such, during regular maintenance procedures, any conglomeration of particles can be emptied without applying any modifications to the assembly.

The gas inlet assembly described above was exposed to a wide range of plasma conditions in a production environment for 6 months. The ranges of the conditions were as follows:

Gas flows varying from 10 to 5000 sccm
Pressure varying from 5 to 10000 mTorr
RF power varying from 20 to 5000 W.

The inspection of the gas inlet assembly after the production runs did not show any degradation of the gas inlet.

The invention claimed is:

1. Plasma processing apparatus comprising:
   a chamber to which one or more gases are introduced when in use, the gases being used to generate a plasma within the chamber;
   an RF signal generator for generating an alternating electrical potential;
   at least one electrode to which an alternating electrical potential is applied in use so as to generate the plasma;
   one or more gas port assemblies for supplying or removing one or more gases to a powered electrode in the plasma processing chamber, the assembly being electrically insulated from the at least one electrodes, the assembly comprising, a number of dielectric members and a number of electrically conductive members, the members being arranged in a stack of alternating dielectric and electrically conductive members, and wherein each member comprises at least one gas pathway for the passage of the gases, such that when stacked the gas pathways are in communication with each other and the gases are able to pass between an outer side of the stack and a chamber side of the stack, the members acting as a capacitive divider to reduce high voltages within the assembly; and
   at least one insulator for electrically insulating the one or more gas port assemblies from the electrodes.

2. A gas port assembly according to claim 1, wherein assembly is arranged such that the peak operating voltage is greater than about 2 kV.

3. A gas port assembly according to claim 1, wherein at least three dielectric members and at least two metallic members are provided.

4. A gas port assembly according claim 1, wherein the gas pathways are arranged relative to one another such that the gases follow a pre-defined path through the assembly.

5. A gas port assembly according to claim 1, wherein the dielectric members are arranged as discs, each having a number of ducts within them so as to provide the gas pathways, wherein for each disc, the ducts are positioned at locations which are dissimilar to those within an adjacent disc within the stack.

6. A gas port assembly according to claim 5, wherein the diameter of each duct is about 2 mm or less.

7. A gas port assembly according to claim 5, wherein the width to height aspect ratio of the ducts through the dielectric members lies in the range 0.2 to 1.0.

8. A gas port assembly according to claim 1, wherein the dielectric members are formed from a ceramic or plastics material.

9. A gas port assembly according to claim 8, wherein the dielectric members are formed from PTFE.

10. A gas port assembly according to claim 1, wherein the electrically conductive members are formed as gauzes or meshes.

11. A gas port assembly according to claim 9, wherein the electrically conductive members are formed from a corrosion resistant alloy.

12. A gas port assembly according claim 10, wherein the gauzes or meshes are arranged to act as particle filters.

13. A gas port assembly according to claim 1, wherein the members are adapted to reduce discharges when the electrodes is operated at radio frequencies.

14. A gas port assembly according to claim 13, adapted for use with a frequency of about 13.56 MHz.

15. A gas port assembly according to claim 1, wherein the power supplied to the electrodes in use is in the range 20 to 5000 Watts.

16. A gas port assembly according to claim 1, adapted for use at a gas flow rate in the range 10 to 5000 sccm.

17. A gas port assembly according to claim 1, adapted for use with a gas pressure within the chamber in the range 5 to 10000 mTorr.

18. A gas port assembly according to claim 1 wherein at least one surface of an end dielectric member within the stack comprises a recess for partially accommodating one of the electrically conductive members so as to reduce fringe electric fields.

19. A gas port assembly according to claim 1, further comprising one or each of:
    the said one or more electrodes to which the alternating electrical potential is supplied when in use; and,
    an insulator for electrically insulating the members of the assembly from the electrodes.

20. A gas port assembly according to claim 19 and when comprising an insulator, wherein the insulator and one or more of the dielectric members are formed as an integral unit.

21. A gas port assembly according to claim 19, wherein the assembly further comprises a coupling device such that the assembly can be removably coupled to the chamber.

22. A gas port assembly kit comprising a gas port assembly according to claim 19 and one or more additional electrically conductive and/or dielectric members for selective use with the gas port assembly.

* * * * *